United States Patent
Wang et al.

(10) Patent No.: US 11,960,180 B2
(45) Date of Patent: Apr. 16, 2024

(54) DISPLAY DEVICE WITH CONDUCTIVE STRUCTURE AND PERFORATED LIGHT-SHIELDING LAYER IN SAME LAYER

(71) Applicant: BOE TECHNOLOGY GROUP CO., LTD., Beijing (CN)

(72) Inventors: Chunyang Wang, Beijing (CN); Hongwei Tian, Beijing (CN); Dong Li, Beijing (CN); Liangjian Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 229 days.

(21) Appl. No.: 17/256,192

(22) PCT Filed: Apr. 22, 2020

(86) PCT No.: PCT/CN2020/086199
§ 371 (c)(1),
(2) Date: Dec. 26, 2020

(87) PCT Pub. No.: WO2020/216259
PCT Pub. Date: Oct. 29, 2020

(65) Prior Publication Data
US 2021/0265453 A1     Aug. 26, 2021

(30) Foreign Application Priority Data

Apr. 26, 2019 (CN) .......................... 201910345749.2

(51) Int. Cl.
*G02F 1/1345* (2006.01)
*G06V 40/13* (2022.01)
(Continued)

(52) U.S. Cl.
CPC ...... *G02F 1/13452* (2013.01); *G06V 40/1318* (2022.01); *H01L 24/32* (2013.01);
(Continued)

(58) Field of Classification Search
CPC ..... H01L 27/3276; H01L 24/32; H01L 25/18; H01L 27/3272; H01L 51/56;
(Continued)

(56) References Cited

U.S. PATENT DOCUMENTS

2018/0197885 A1* 7/2018 Lee ..................... G06F 3/04164
2018/0373913 A1   12/2018 Panchawagh et al.
(Continued)

FOREIGN PATENT DOCUMENTS

CN    106384740 A    2/2017
CN    106973520 A    7/2017
(Continued)

OTHER PUBLICATIONS

First office action of Chinese application No. 201910345749.2 dated Sep. 14, 2020.
(Continued)

*Primary Examiner* — Nduka E Ojeh
*Assistant Examiner* — Laura M Dykes
(74) *Attorney, Agent, or Firm* — Lippes Mathias LLP (57) ABSTRACT

A display panel, a display apparatus, and a manufacturing method are disclosed. The display panel includes a base substrate having a first through hole; a conductive structure located on the base substrate and at least partially covering the first through hole; and a display structure including a first display structure, a control line, and a second display structure that are arranged in layers on a side of the base substrate where the conductive structure is located, wherein the first display structure has a second through hole, and the control line is electrically connected to the conductive structure by passing through the second through hole.

13 Claims, 5 Drawing Sheets

(51) Int. Cl.
    *H01L 23/00*    (2006.01)
    *H01L 25/18*    (2023.01)
    *H10K 59/126*   (2023.01)
    *H10K 59/131*   (2023.01)
    *H10K 71/00*    (2023.01)
    *H10K 59/12*    (2023.01)

(52) U.S. Cl.
    CPC ........... *H01L 25/18* (2013.01); *H10K 59/126* (2023.02); *H10K 59/131* (2023.02); *H10K 71/00* (2023.02); *H01L 2224/32225* (2013.01); *H10K 59/1201* (2023.02)

(58) Field of Classification Search
    CPC ..... H01L 2224/32225; H01L 2227/323; H01L 27/3234; H01L 23/4985; H01L 24/29; H01L 24/45; H01L 24/48; H01L 2224/29139; H01L 2224/32227; H01L 2224/32237; H01L 2224/45015; H01L 2224/45139; H01L 2224/48227; H01L 2224/48228; G02F 1/13452; G02F 1/13338; G02F 1/133305; G02F 1/1333; G06V 40/13; G06V 40/1318; H10K 59/126; H10K 59/131; H10K 71/00; H10K 59/1201; H10K 59/65
    USPC .......................................................... 257/40
    See application file for complete search history.

(56) References Cited

U.S. PATENT DOCUMENTS

| | | | | |
|---|---|---|---|---|
| 2019/0011754 | A1* | 1/2019 | Chen | G02F 1/1368 |
| 2019/0212600 | A1* | 7/2019 | Yueh | G02F 1/1333 |
| 2019/0227361 | A1* | 7/2019 | Yueh | H01L 27/3234 |
| 2020/0043992 | A1 | 2/2020 | Zuo et al. | |
| 2020/0066825 | A1 | 2/2020 | Yang et al. | |
| 2020/0168694 | A1* | 5/2020 | Shin | H01L 27/3276 |
| 2020/0236792 | A1 | 7/2020 | Dong et al. | |
| 2020/0242320 | A1* | 7/2020 | Zeng | G02B 5/3025 |
| 2020/0359499 | A1* | 11/2020 | Hwu | H05K 1/147 |
| 2020/0403168 | A1* | 12/2020 | Li | H01L 27/3276 |

FOREIGN PATENT DOCUMENTS

| | | |
|---|---|---|
| CN | 107039377 A | 8/2017 |
| CN | 109065756 A | 12/2018 |
| CN | 109103231 A | 12/2018 |
| CN | 109524421 A | 3/2019 |
| CN | 109585462 A | 4/2019 |
| CN | 110047899 A | 7/2019 |

OTHER PUBLICATIONS

Second office action of Chinese application No. 201910345749.2 dated Feb. 20, 2021.

* cited by examiner

"DISPLAY DEVICE WITH CONDUCTIVE STRUCTURE AND PERFORATED LIGHT-SHIELDING LAYER IN SAME LAYER"

The present application is 371 of PCT Application No. PCT/CN2020/086199, filed on Apr. 22, 2020, which claims priority to Chinese Patent Application No. 201910345749.2, filed on Apr. 26, 2019 and titled "DISPLAY PANEL, DISPLAY DEVICE, AND FABRICATING METHOD", which is incorporated herein by reference in their entireties.

TECHNICAL FIELD

The present disclosure relates to the field of display technology, and in particular to a display panel, a display device, and a manufacturing method.

BACKGROUND

Currently, for reducing the width of the bezel of a display panel, it is a common setting to provide the control integrated circuit (IC) at the back of the display panel, and then bend the control line inside the display panel to the back to make it connect with the control IC.

In a kind of display panel which uses a flexible base substrate, the flexible base substrate is bent to the back of the display panel, and the control line of the display panel passes through the bent part to connect with the control IC at the back.

SUMMARY

Embodiments of the present disclosure provide a display panel, a display device, and a manufacturing method. The technical solutions are as follows.

According to one aspect of the present disclosure, a display panel is provided, including:
  a base substrate, having a first through hole;
  a conductive structure, located on the base substrate and at least partially covering the first through hole; and
  a display structure, including a first display structure, a control line, and a second display structure that are arranged in layers on a side of the base substrate where the conductive structure is located, wherein the first display structure has a second through hole, and the control line is electrically connected to the conductive structure by passing through the second through hole.

Optionally, the display panel includes a fingerprint recognition assembly, the fingerprint recognition assembly including a perforated light-shielding layer and a fingerprint recognition sensor,
  wherein the conductive structure and the perforated light-shielding layer are structures located in a same layer, and the fingerprint recognition sensor is located on a side of the perforated light-shielding layer distal from the display structure.

Optionally, the display panel includes a base layer located between the conductive structure and the first display structure,
  wherein the base layer has a third through hole in communication with the second through hole of the first display structure, and the control line is electrically connected to the conductive structure by passing through the second through hole and the third through hole.

Optionally, each of the base layer and the base substrate includes a polyimide PI structure layer and a barrier layer that are arranged in layers along a direction close to the display structure.

Optionally, a material of the barrier layer includes silicon oxide.

Optionally, a material of the conductive structure and a material of the perforated light-shielding layer include metal.

Optionally, the conductive structure is located within a display region of the display panel.

Optionally, the first display structure includes a buffer layer and an active layer.

Optionally, a material of the buffer layer includes silicon nitride or silicon oxide.

Optionally, the second display structure includes a driving circuit layer, an organic light-emitting layer, and a package layer that are sequentially arranged along a direction away from the first display structure.

Optionally, the second display structure includes a liquid crystal layer and a color filter substrate that are sequentially arranged along a direction away from the first display structure.

Optionally, the fingerprint recognition sensor is located on a side of the base substrate distal from the display structure.

Optionally, the first through hole and the second through hole are coaxial.

Optionally, an orthographic projection of the first through hole onto the base substrate is located within an area formed from an orthographic projection of the conductive structure onto the base substrate.

Optionally, the display panel includes the fingerprint recognition assembly, the fingerprint recognition assembly including a perforated light-shielding layer and a fingerprint recognition sensor,
  wherein the conductive structure and the perforated light-shielding layer are structures in a same layer, the fingerprint recognition sensor is located on a side of the perforated light-shielding layer distal from the display structure, and the conductive structure is located within a display region of the display panel;
  the display panel includes a base layer, the base layer being located between the conductive structure and the first display structure,
  wherein the base layer includes a third through hole in communication with the second through hole of the first display structure, and the control line is electrically connected to the conductive structure by passing through the second through hole and the third through hole;
  the first display structure includes a buffer layer and an active layer, the second display structure includes a driving circuit layer, an organic light-emitting layer, and a package layer that are sequentially arranged along a direction away from the first display structure; and
  the first through hole and the second through hole are coaxial, and an orthographic projection of the first through hole on the base substrate is located within an area formed from an orthographic projection of the conductive structure onto the base substrate.

In another aspect, a method of manufacturing a display panel is provided, including:
  providing a base substrate;
  forming a conductive structure on the base substrate;
  forming a display structure on the base substrate on which the conductive structure has been formed, wherein the display structure includes a first display structure, a control line, and a second display structure that are arranged in layers on a side of the base substrate where the conductive structure is located, the first display structure includes a second through hole, and the control line is electrically connected to the conductive structure by passing through the second through hole; and forming a first through hole in the base substrate, wherein the conductive structure at least partially covers the first through hole.

Optionally, forming the conductive structure on the base substrate includes:

forming the conductive structure and a perforated light-shielding layer on the base substrate by a same patterning process, wherein the display panel includes a fingerprint recognition assembly, the fingerprint recognition assembly includes the perforated light-shielding layer and a fingerprint recognition sensor, and the fingerprint recognition sensor is located on a side of the perforated light-shielding layer distal from the display component.

Optionally, forming the first through hole in the base substrate includes:

forming the first through hole in the base substrate by a laser drilling process.

In yet another aspect, a display device is provided, including a control integrated circuit (IC) and a display panel, wherein the display panel includes: a base substrate; a conductive structure located on the base substrate, the base substrate including a first through hole, the conductive structure at least partially covering the first through hole; and a display structure including a first display structure, a control line, and a second display structure that are arranged in layers on a side of the base substrate where the conductive structure is located, the first display structure including a second through hole, and the control line being electrically connected to the conductive structure by passing through the second through hole, and wherein the control IC is electrically connected to the conductive structure by passing through the first through hole.

Optionally, the display device includes a flexible base, wherein the control IC is located on the flexible base and is electrically connected to the conductive structure by the flexible base.

Optionally, the first through hole includes a conductive adhesive, and the control IC is electrically connected to the conductive adhesive.

BRIEF DESCRIPTION OF DRAWINGS

To describe the technical solutions in the embodiments of the present disclosure more clearly, the following brief introduction is made on the accompanying drawings required for illustrating the embodiments. Apparently, the accompanying drawings in the following description show merely some embodiments of the present disclosure, and a person of ordinary skill in the art may derive other drawings from these accompanying drawings without creative efforts.

Some specific embodiments of the present disclosure are shown in the accompanying drawings above, and further description is made below in detail. These accompanying drawings and descriptions are not used to limit the scope of the concept of the present disclosure in any manner. Instead, the concept of the present disclosure is illustrated for a person skilled in the art with reference to specific embodiments.

DESCRIPTION OF EMBODIMENTS

Some embodiments of the present disclosure are described below with reference to the accompanying drawings.

Figure 1:
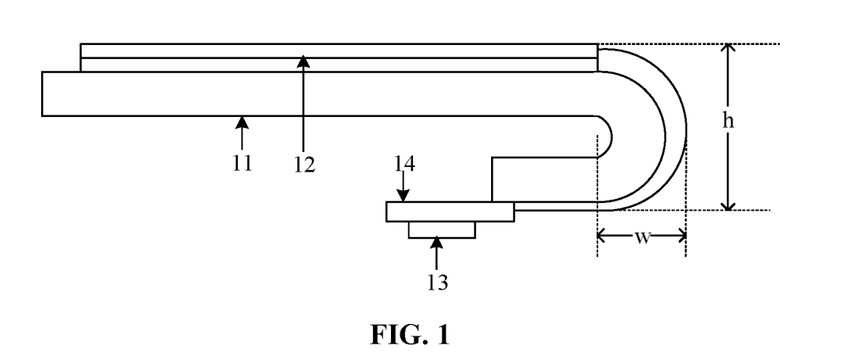
FIG. 1 is a schematic structural diagram of a display device.

FIG. 1 is a schematic structural diagram of a display device. The display device includes a display panel and a control IC-13. The display panel includes a base substrate 11 and a control line 12 disposed on the base substrate 11. The control IC-13 is located on a flexible base 14, and the flexible base 14 is located on the base substrate 11. The flexible base 14 and the IC-13 located thereon can be collectively referred to as a Chip On Film (COF). The flexible base 14 may include a flexible layer (which may be made of PI), a conductive circuitry located on the flexible layer, and the like.

The base substrate 11 of the display panel is made of a flexible material, to enable the flexible base 14 and the IC-13 to be bent to the back of the display panel (the back of the display panel refers to the face of the display panel that does not display an image) to reduce the bezel of the display panel. The control line 12 is electrically connected to the control IC-13 via the bent part and the flexible base 14.

Although in the configuration shown in FIG. 1, the bezel (the bezel of the display panel may refer to the portion of the display panel other than the display region) of the display panel can be reduced to a certain degree, a bent part w of the display panel would still lead to an increase in the bezel of the display panel, and the bending may probably further cause various defects (for example, various lines may fracture due to the bending) to the display panel.

In addition, in a configuration in which a hole is directly drilled at the back of the display panel, to enable the control IC at the back to be electrically connected to the control line inside the display panel, as the depth of the hole that needs to be drilled is excessively large (the hole that is formed by directly penetrating from the back of the display panel to the layer in which the control line is located has a relatively large depth, and thus drilling such an excessively deep hole has a relatively high technical difficulty and may probably cause severe problems such as the damage of the display panel), therefore, it is very difficult to implement such configuration.

In addition, in the configuration shown in FIG. 1, as the display panel is bent, the thickness of the bent part of the display panel may be even greater than twice the thickness of the display panel, making it quite unfavorable to the development trend of light and thin display panels.

Figure 2:
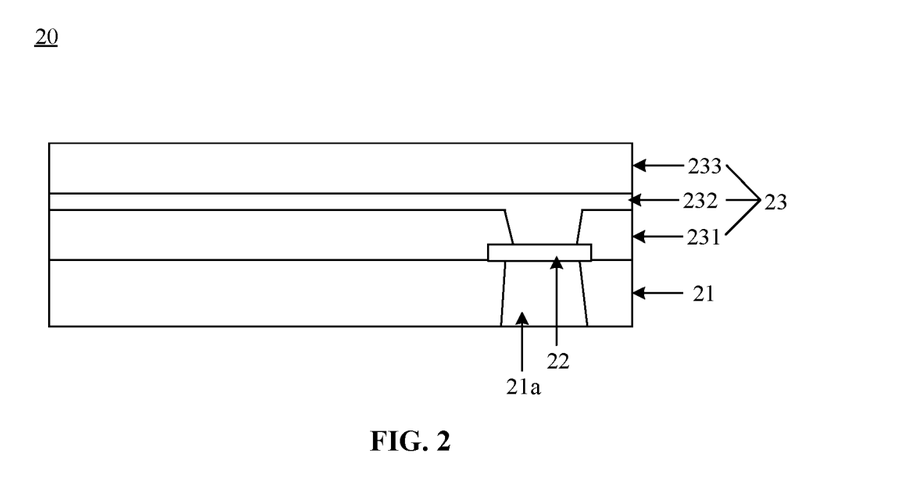
FIG. 2 is a schematic structural diagram of a display panel according to some embodiments of the present disclosure.

FIG. 2 is a schematic structural diagram of a display panel according to some embodiments of the present disclosure. The display panel 20 may include:
- a base substrate 21;
- a conductive structure 22 located on the base substrate 21, wherein the base substrate 21 has a first through hole 21a; and the conductive structure 22 at least partially covers the first through hole 21a, that is, on a side of the base substrate 21 where the conductive structure 22 is not disposed, the conductive structure 22 is exposed via the first through hole 21a; and
- a display structure 23, including a first display structure 231, a control line 232, and a second display structure 233 that are arranged in layers on a side of the base substrate 21 where the conductive structure 22 is located, wherein the first display structure 231 has a second through hole (not shown in FIG. 2), and the control line 232 is electrically connected to the conductive structure 22 by passing through the second through hole.

In summary, in the display panel provided in the embodiments of the present disclosure, by providing the conductive structure between the display structure and the base substrate, and providing a through hole in the first display structure on one side of the conductive structure and the base substrate on the other side of the conductive structure respectively, the conductive structure is electrically connected with the control line by means of the through hole between the conductive structure and the control line, and is also electrically connected with the control IC at the back of the display panel by means of the through hole in the base substrate. In this way, the control IC at the back of the display panel can be electrically connected with the control line inside the display panel. As the bending of base substrate is not required, the added width of the bezel resulted from the bent part can be reduced. As such, the bezel of the display panel can be narrowed.

Figure 3:
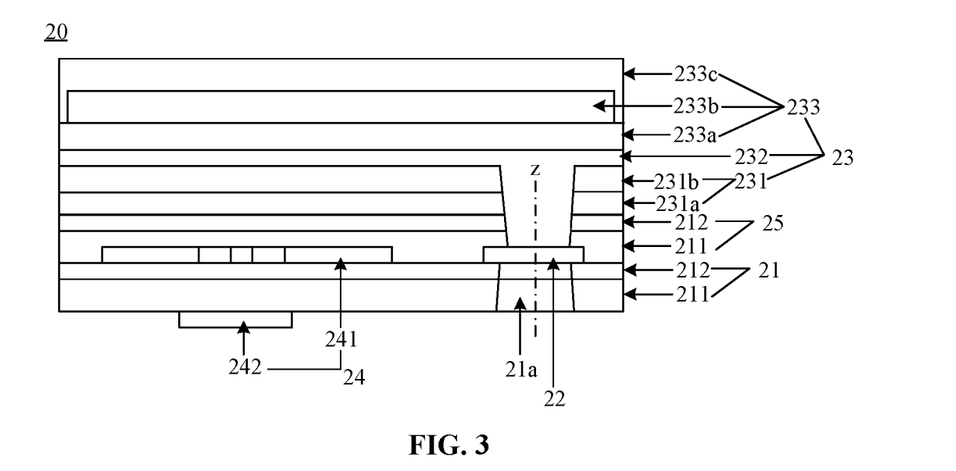
FIG. 3 is a schematic structural diagram of another display panel according to some embodiments of the present disclosure.

FIG. 3 is a schematic structural diagram of another display panel according to some embodiments of the present disclosure. Some adjustments are made to the display panel based on the display panel shown in FIG. 2.

Optionally, the display panel 20 includes a fingerprint recognition assembly 24 which includes a perforated light-shielding layer 241 and a fingerprint recognition sensor 242. The fingerprint recognition sensor 242 is located on a side of the perforated light-shielding layer 241 distal from the display structure 23. The display structure can emit a light ray (the light ray may be a light ray used for display or for fingerprint recognition). After being emitted from the display panel, the light ray may be reflected by a touch object (the touch object may include a finger, a palm, a stylus, and the like). The perforated light-shielding layer 241 may have a plurality of apertures, to enable light emitted by the display structure and then reflected by the touch object to pass through the perforated light-shielding layer 241 so that it can be sensed by the fingerprint recognition sensor 242. The conductive structure 22 and the perforated light-shielding layer 241 are formed from a same patterning process and thus are structures located in a same layer. That is, the conductive structure 22 and the perforated light-shielding layer 241 are formed from a same mask in a same patterning process, so that the process is convenient and fast, manufacturing costs are reduced, and the structure of the display panel is further simplified.

FIG. 3 shows a configuration in which the fingerprint recognition sensor 242 is located on a side of the base substrate 21 distal from the display structure 23. In this configuration, the impact between the fingerprint recognition sensor 242 and the display structure 23 caused by placing the fingerprint recognition sensor 242 on a side of the base substrate 21 close to the display structure 23 can be avoided. However, in the display panel provided in some embodiments of the present disclosure, the fingerprint recognition sensor 242 may be located at other positions, for example, may be located on a side of base substrate 21 close to the display structure 23. This is not limited in this embodiment of the present disclosure.

Optionally, the first through hole 21a and the second through hole are coaxial. As shown in FIG. 3, the first through hole 21a and the second through hole share the axis z, and thus the area occupied by the first through hole and the second through hole on the display panel can be reduced, and the impact of the structure on the bezel of the display panel can be reduced. Exemplarily, both the first through hole and the second through hole may be circular holes. The two circular holes may be provided in alignment.

Optionally, an orthographic projection of the first through hole 21a onto the base substrate is located within an area formed from an orthographic projection of the conductive structure 22 onto the base substrate. That is, the conductive structure 22 may completely cover the first through hole 21a, and thus the contact area between the conductive structure 22 and the control IC can be increased, thereby improving the performance of electrical connection.

Figure 4:
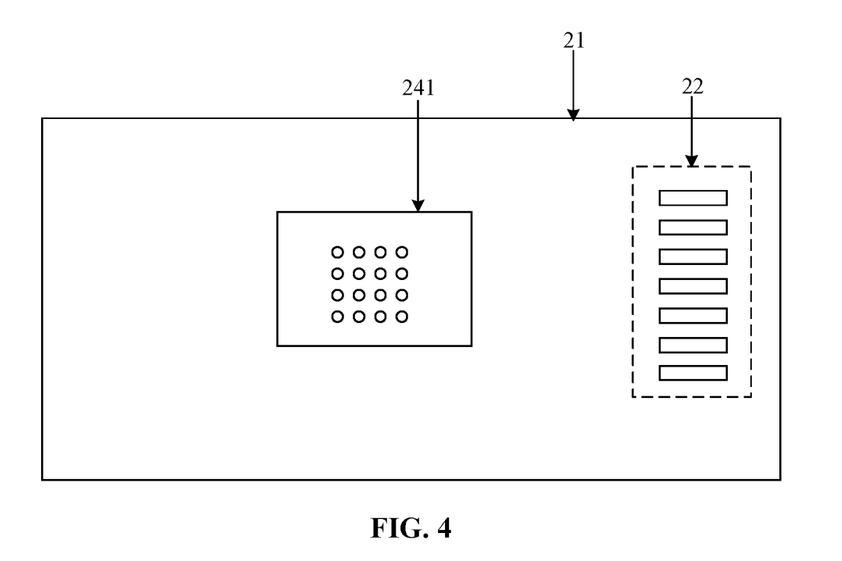
FIG. 4 is a top view of structures such as a perforated light-shielding layer and a conductive structure in the display panel shown in FIG. 3.

FIG. 4 is a top view of structures such as the perforated light-shielding layer 241 and the conductive structure 22 in the display panel shown in FIG. 3. The perforated light-shielding layer 241 is provided with a plurality of apertures. Light emitted by the display structure and then reflected by the touch object can pass through the plurality of apertures and be sensed by the fingerprint recognition sensor 242. The conductive structure 22 includes a plurality of block structures, to facilitate the connection (or referred to as bonding) with a plurality of contacts on the control IC.

In the display panel provided in some embodiments of the present disclosure, the fingerprint recognition assembly and the perforated light-shielding layer 241 therein may implement the function of in-display fingerprint recognition based on the pinhole imaging principle. The perforated light-shielding layer 241 may be formed by a plasma enhanced chemical vapor deposition (PECVD) process (or other vapor deposition processes).

Optionally, the conductive structure 22 and the perforated light-shielding layer 241 may include metal material. A metal material usually has relatively high conductivity performance and light-shielding performance, so that the requirement on the conductivity performance of the conductive structure 22 and the requirement on the light-shielding performance of the perforated light-shielding layer 241 can be satisfied.

As shown in FIG. 3, the display panel 20 includes a base layer 25 located between the conductive structure 22 and the first display structure 231. The base layer 25 includes a third through hole (not shown in FIG. 3) in communication with the second through hole (not shown in FIG. 3) of the first display structure 231. The control line 232 (the control line may include lines such as a VSS (a common connection line), a VDD (a working voltage connection line), and the like) is electrically connected to the conductive structure 22 by means of the second through hole and the third through hole. That is, a base structure of the display panel 20 may be jointly formed by the base layer 25 and the base substrate 21. The conductive structure 22 and the perforated light-shielding layer 241 may be located between the base layer 25 and the base substrate 21. The second through hole and the third through hole may both be formed by using a patterning process.

In some embodiments of the present disclosure, the used patterning process may include: forming a photoresist, exposing and developing the photoresist, using the developed photoresist as a mask to etch a film layer below the mask, peeling the photoresist, and the like.

In a kind of display panels, the perforated light-shielding layer is usually located on the entire base structure, and a structure such as an active layer will be formed on the perforated light-shielding layer 241 in a subsequent process, as such, to prevent the perforated light-shielding layer 241 from being damaged (for example, the perforated light-shielding layer 241 may be severely influenced by a process such as laser annealing) in the process of forming the active layer, a protection layer (for example, formed by a chemical vapor deposition process with a relatively low power so as to form a silicon oxide layer functioning as the protection layer) can be formed on the perforated light-shielding layer 241 first to protect the perforated light-shielding layer 241. However, as a result, the structure of such display panels is relatively complex, and manufacturing costs and manufacturing duration would be increased as well. In addition, the apertures in the perforated light-shielding layer may further influence the flatness of the active layer thereon and the laser annealing, causing the crystallization of grains in the active layer not uniform, and influencing the display effect of the display panel.

In some embodiments of the present disclosure, the perforated light-shielding layer 241 and the conductive structure 22 are arranged between the base layer 25 and the base substrate 21, as such, the perforated light-shielding layer 241 and the conductive structure 22 are protected by the base layer 25, and there is no need to form a protection layer. In this way, the structure of the display panel and manufacturing process thereof can be simplified, and manufacturing costs can be reduced. In addition, the base layer can function as a planarization layer, and the perforated light-shielding layer is relatively far away from the active layer, thus, the perforated light-shielding layer would not influence the flatness of the active layer, so that the degree of crystallinity of the grains in the active layer after laser annealing is relatively uniform, thereby improving the display effect of the display panel.

Optionally, each of the base layer 25 and the base substrate 21 includes a PI structure layer 211 and a barrier layer 212 that are in layers along a direction close to the display structure 23. The material of the barrier layer 212 may include silicon oxide. The PI structure layer 211 and barrier layer 212 which are in layers may form a base structure with relatively adequate performance, and the PI structure layer 211 may be located on a side of the barrier layer 212 distal from the conductive structure. In addition, the PI structure layer 211 may be alternatively located on a side of the barrier layer 212 close to the conductive structure. This is not limited in this embodiment of the present disclosure.

Optionally, the conductive structure 22 is located within a display region (not shown in FIG. 3) of the display panel. As the conductive structure 22 is located in the base structure jointly formed by the base layer 25 and the base substrate 21, the display structure would not be blocked, and thus the normal displaying of the display panel would not be influenced. Therefore, the conductive structure 22 may be located within the display region of the display panel, and thus the width of the bezel of the display panel can be reduced. In addition, the conductive structure 22 may be alternatively located within a peripheral area other than the display region of the display panel. This is not limited in this embodiment of the present disclosure.

Optionally, the first display structure 231 includes a buffer layer 231a and an active layer 231b. The material of the buffer layer 231a may include silicon nitride or silicon oxide. The active layer 231b may be made of polysilicon. The polysilicon may be obtained from amorphous silicon through an annealing process (for example, an excimer laser annealing (ELA) process).

Optionally, according to different display principles of display panels, the second display structure 233 may include different components. Exemplarily, when the display panel is an organic light-emitting diode display panel, the second display structure 233 may include a driving circuit layer 233a, an organic light-emitting layer 233b, and a package layer 233c that are sequentially arranged along a direction away from the first display structure 231. The driving circuit layer 233a may include structures such as a pixel circuit and a control lead that can drive the organic light-emitting layer. The organic light-emitting layer 233b may include structures such as an anode, an electroluminescent (EL) layer, and a cathode that are sequentially arranged in layers. The package layer 233c may be a package layer formed by a thin film package technology or other related technology. For example, the package layer 233c may be a glass adhesive package layer.

In addition, when the display panel is a liquid crystal display panel, the second display structure 233 may include structures such as a liquid crystal layer and a color filter substrate.

Optionally, the first through hole 21a may be formed by a laser drilling process. A hole may be drilled, by using a laser drilling process, at the back of the display panel until the conductive structure 22 is exposed, after other structures of the display panel have been manufactured. The first through hole 21a may be used to enable the conductive structure 22 to be electrically connected to the control IC at the back of the display panel.

In the display panel provided in the embodiments of the present disclosure, the edge area does not need to be bent. Therefore, the overall thickness of the display panel would not be increased due to the bending, and thus the entire display panel is relatively thin, which is favorable to the development trend of light and thin display panels.

In summary, in the display panel provided in the embodiments of the present disclosure, by providing the conductive structure between the display structure and the base substrate, and providing a through hole in the first display structure on one side of the conductive structure and the base substrate on the other side of the conductive structure respectively, the conductive structure is electrically connected with the control line by means of the through hole between the conductive structure and the control line, and is also electrically connected with the control IC at the back of the display panel by means of the through hole in the base substrate. In this way, the control IC at the back of the display panel can be electrically connected with the control line inside the display panel. As the bending of base substrate is not required, the added width of the bezel resulted from the bent part can be reduced. As such, the bezel of the display panel can be narrowed.

Figure 5:
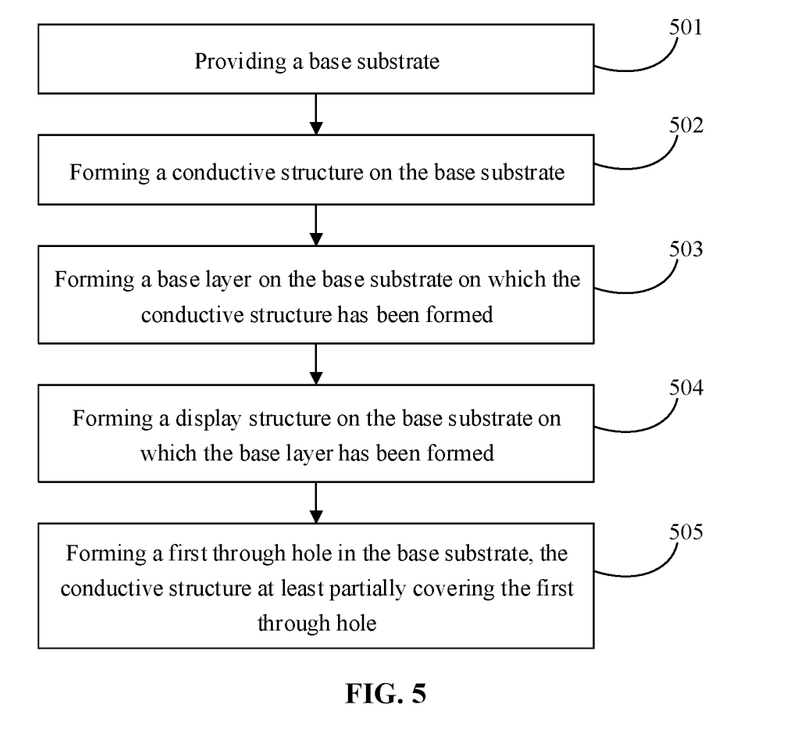
FIG. 5 is a flowchart showing a method of manufacturing a display panel according to some embodiments of the present disclosure.

FIG. 5 is a flowchart showing a method of manufacturing a display panel according to some embodiments of the present disclosure. The method includes the following steps.

In step 501, a base substrate is provided.

The base substrate may be a multi-layered structure including a PI structure layer and a barrier layer. Exemplarily, for the structure of the base substrate, reference can be made to the base substrate 21 of the display panel shown in FIG. 3 and the corresponding descriptions. Details are not described herein again in this embodiment of the present disclosure.

In step 502, a conductive structure is formed on the base substrate.

During the formation of the conductive structure, a perforated light-shielding layer may also be formed in the same patterning process. The perforated light-shielding layer is a component of a fingerprint recognition assembly. The fingerprint recognition assembly further includes a fingerprint recognition sensor. The perforated light-shielding layer allows the light emitted by a display structure and then reflected by a touch object to pass through, so as to enable the light to be sensed by the fingerprint recognition sensor.

Figure 6:
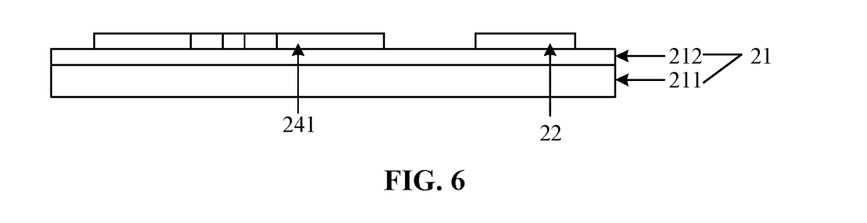
FIG. 6 is schematic structural diagram of a base substrate in the embodiments shown in FIG. 5.

FIG. 6 is schematic structural diagram of the base substrate when step 502 is done. The perforated light-shielding layer 241 and the conductive structure 22 are formed on the base substrate 21. The base substrate 21 includes a PI structure layer 211 and a barrier layer 212 that are arranged in layers along a direction close to the display structure 23. For the structures of the perforated light-shielding layer 241 and the conductive structure 22, reference can be made to FIG. 4 and the corresponding descriptions. Details are not described herein again in this embodiment of the present disclosure.

In step 503, a base layer is formed on the base substrate on which the conductive structure has been formed.

Similar to the structure of the base substrate, the structure of the base layer may also be a multi-layered structure including a PI structure layer and a barrier layer.

In step 504, a display structure is formed on the base substrate on which the base layer has been formed.

The display structure includes a first display structure, a control line, and a second display structure that are sequentially formed on a side of the base substrate where the conductive structure is located, the first display structure has a second through hole (the second through hole can be formed by using a patterning process), and the control line is electrically connected to the conductive structure by passing through the second through hole. For the first display structure, the control line, and the second display structure, reference can be made to the first display structure 231, the control line 232, and the second display structure 233 in the display panel shown in FIG. 3. Details are not described herein again in this embodiment of the present disclosure.

Figure 7:
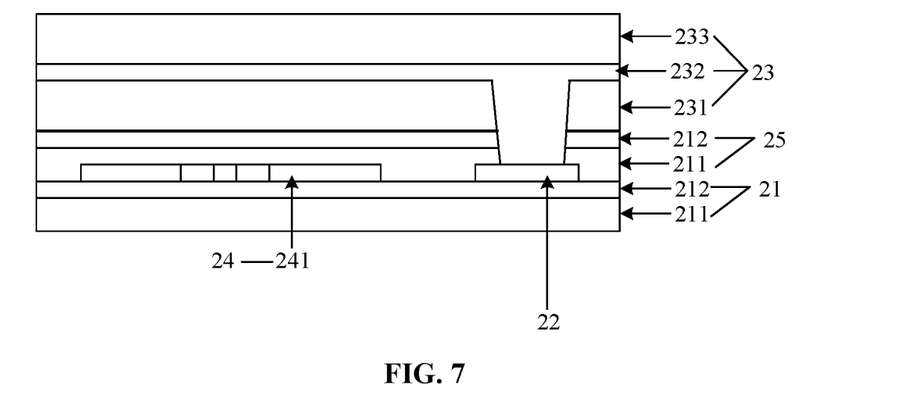
FIG. 7 is schematic structural diagram of another base substrate in the embodiments shown in FIG. 5.

FIG. 7 is schematic structural diagram of the base substrate when step 503 is done. The control line 232 is electrically connected to the conductive structure 22 by passing through the through holes on the first display structure 231 and the base layer 25. For the meanings of other reference signs in FIG. 7, reference can be made to FIG. 3. Details are not described herein again.

It should be noted that step 503 in this embodiment of the present disclosure may be an optional step. That is, when step 502 is done, the base layer is not formed and step 504 is performed. Correspondingly, the display structure is formed on the base substrate on which the conductive structure has been formed.

In step 505, a first through hole is formed in the base substrate, wherein the conductive structure at least partially covers the first through hole.

The through hole can be formed by laser drilling the base substrate from the side where the conductive structure is not located, and then the conductive structure can be exposed from the through hole. The conductive structure may at least partially cover the first through hole. As only the base substrate is penetrated, the depth of the first through hole is relatively shallow, and thus the drilling difficulty is relatively low.

Figure 8:
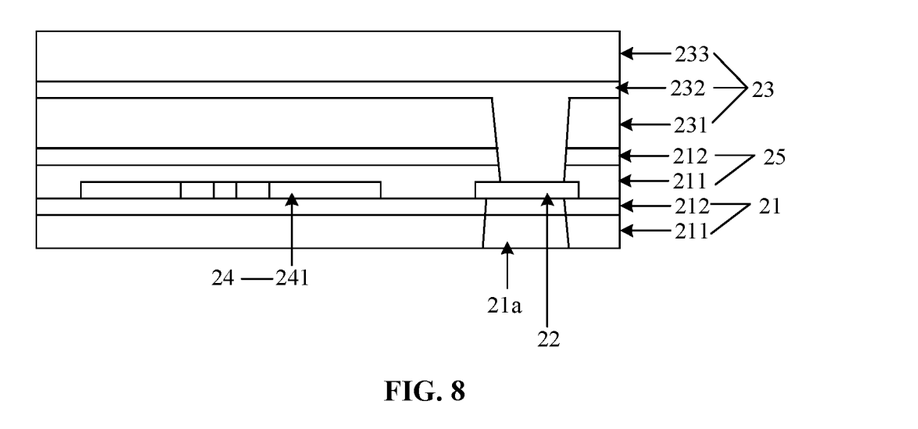
FIG. 8 is schematic structural diagram of another base substrate in the embodiments shown in FIG. 5.

FIG. 8 is schematic structural diagram of the base substrate when step 505 is done. The conductive structure 22 is exposed from the first through hole 21a. Subsequently, the conductive structure 22 may be electrically connected with the control IC by means of the through hole, so that the control IC can be electrically connected with the control line 232 inside the display panel via the conductive structure 22, and thus the display panel does not need to be bent. That is, by electrically connecting the control IC located at the back of the display panel with the control line inside the display panel, such configuration can avoid various defects of the display panel due to the bending and the reduction of the bezel of the display panel can be achieved.

For the meanings of other reference signs in FIG. 8, reference can be made to FIG. 3. Details are not described herein again.

In summary, in the method for manufacturing the display panel provided in the embodiments of the present disclosure, by forming the conductive structure between the display structure and the base substrate, and providing a through hole in the first display structure on one side of the conductive structure and the base substrate on the other side of the conductive structure respectively, the conductive structure is electrically connected with the control line by means of the through hole between the conductive structure and the control line, and is also electrically connected with the control IC at the back of the display panel by means of the through hole in the base substrate. In this way, the control IC at the back of the display panel can be electrically connected with the control line inside the display panel. As the bending of base substrate is not required, the added width of the bezel resulted from the bent part can be reduced. As such, the bezel of the display panel can be narrowed.

Figure 9:
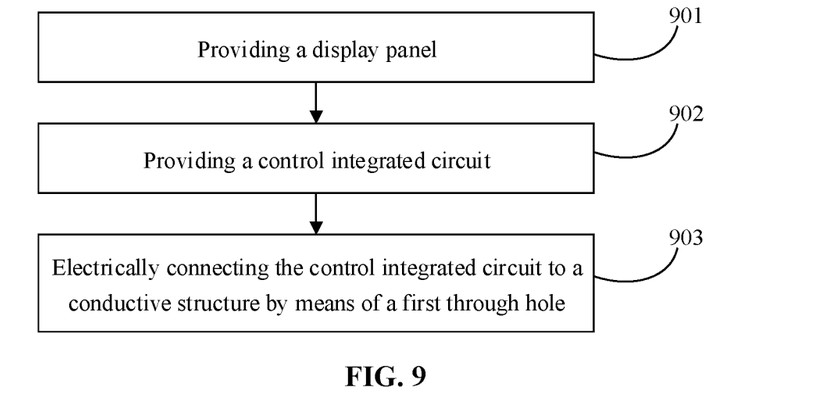
FIG. 9 is a flowchart showing a method of manufacturing a display device according to some embodiments of the present disclosure.

FIG. 9 is a flowchart showing a method of manufacturing a display device according to some embodiments of the present disclosure. The method includes the following steps.

In step 901, a display panel is provided.

The display panel may be the display panel shown in FIG. 3.

In step 902, a control IC is provided.

The control IC may be a component configured to control the display function of the display panel.

In step 903, the control IC is electrically connected to a conductive structure by passing through a first through hole.

The control IC can be arranged on a side of a base substrate distal from the conductive structure, that is, at the back of the display panel. In this configuration, the width of the bezel of the display panel can be reduced. In this embodiment of the present disclosure, the control IC at the back of the display panel may be electrically connected to the conductive structure by passing through the first through hole.

Figure 10:
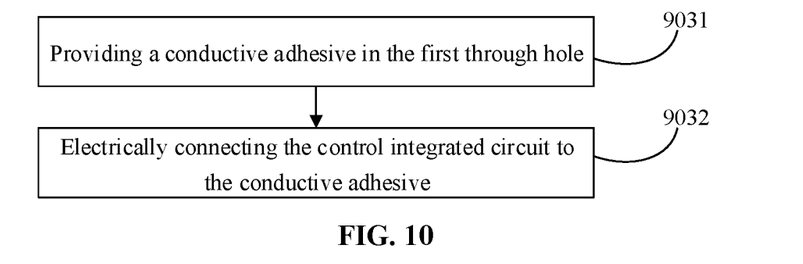
FIG. 10 is a flowchart of electrically connecting a control IC to a conductive structure in the embodiments shown in FIG. 9.

As shown in FIG. 10, step 903 may include the following two substeps:

In substep 9031, a conductive adhesive is provided in the first through hole.

The conductive adhesive is an adhesive having conductivity performance. The conductive adhesive may be provided in the first through hole. The conductive adhesive can be electrically connected to the conductive structure exposed from the first through hole.

In substep 9032, the control IC is electrically connected to the conductive adhesive.

After the control IC is electrically connected to the conductive adhesive, the control IC can be electrically connected to the conductive structure via the conductive adhesive, and thus be electrically connected with a control line inside the display panel.

In addition, the control IC may be electrically connected to the conductive structure through other methods, for example, via a silver nanowire. This is not limited in this embodiment of the present disclosure.

Figure 11:
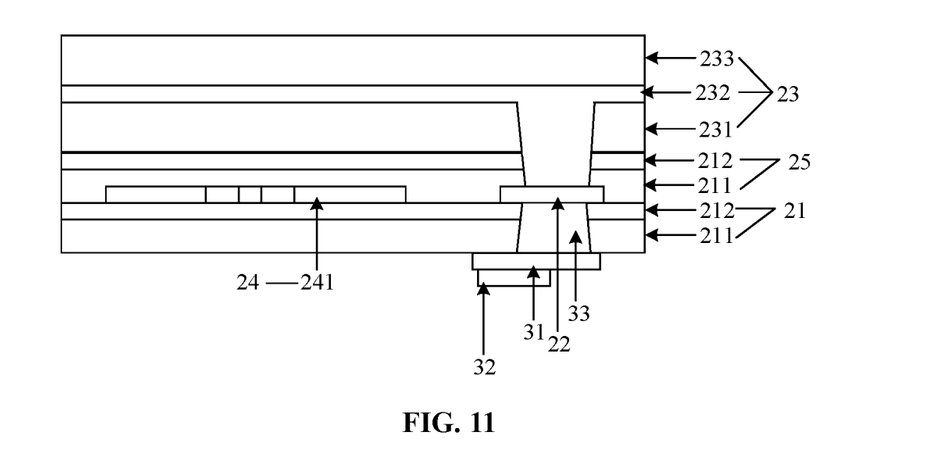
FIG. 11 is schematic structural diagram of a display device in the embodiments shown in FIG. 9.

FIG. 11 is a schematic structural diagram of the display device when step 903 is done. A control IC 32 may be located on a flexible base 31. The conductive adhesive 33 may be electrically connected with the control IC 32 by the flexible base 31 (a wire can be provided on the flexible base 31, and the conductive adhesive 33 may be electrically connected with the control IC 32 via the wire). For the meanings of other reference signs in FIG. 11, reference may be made to FIG. 3. Details are not described herein again.

In summary, in the display panel provided in the embodiments of the present disclosure, by forming the conductive structure between the display structure and the base substrate, and providing a through hole in the first display structure on one side of the conductive structure and the base substrate on the other side of the conductive structure respectively, the conductive structure is electrically connected with the control line by means of the through hole between the conductive structure and the control line, and is also electrically connected with the control IC at the back of the display panel by means of the through hole in the base substrate. In this way, the control IC at the back of the display panel can be electrically connected with the control line inside the display panel. As the bending of base substrate is not required, the added width of the bezel resulted from the bent part can be reduced. As such, the bezel of the display panel can be narrowed.

As shown in FIG. 11, the present disclosure further provides a display device. The display device includes a control IC 32 and a display panel. The display panel includes: a base substrate 21 having a first through hole (not shown in FIG. 11); a conductive structure 22 which is arranged on the base substrate 21 and at least partially covers the first through hole; and a display structure 23 which is disposed on the base substrate 21 on which the conductive structure 22 has been disposed, and the display structure 23 includes a first display structure 231, a control line 232, and a second display structure 233 that are arranged in layers on a side of the base substrate 21 where the conductive structure 22 is located, the first display structure 231 has a second through hole (not shown in FIG. 11), and the control line 232 is electrically connected to the conductive structure 22 by passing through the second through hole.

The control IC 32 is electrically connected to the conductive structure 22 by passing through the first through hole.

Optionally, the display device includes a flexible base 31, which is electrically connected with the conductive structure 22, and the control IC 32 is located on the flexible base 31.

Optionally, a conductive adhesive 33 is provided in the first through hole, and the control IC 32 is electrically connected with the conductive adhesive 33.

It should be noted that in the accompanying drawings, the sizes of the layers and areas may be exaggerated for clear illustration. In addition, it can be understood that when an element or a layer is referred to as being located "on" another element or layer, the element may be directly located on that element or there may be a middle layer intermediating therebetween. In addition, it can be understood that when an element or a layer is referred to as being located "under" another element or layer, the element may be directly located under that element or there may be more than one middle layer or element intermediating therebetween. In addition, it can be further understood that when a layer or an element is referred to as being located "between" two layers or elements, the layer or element may be the only layer between the two layers or elements or there may be more than one middle layer or element intermediating therebetween. Like reference numerals indicate like elements throughout the specification.

In the present disclosure, the terms "first" and "second" are used only for description, but are not intended to indicate or imply relative importance. The term "a plurality of" means two or more than two, unless otherwise clearly specified.

A person of ordinary skill in the art may understand that all or some of the steps of the embodiments can be implemented by hardware or a program which instructs relevant hardware. The program may be stored in a computer-readable storage medium. The storage medium may be a read-only memory, a magnetic disk, an optical disc or the like.

The foregoing is merely optional embodiments of the present disclosure but is not used to limit the present disclosure. Any changes, equivalent replacements, and improvements made within the spirit and principle of the present disclosure shall fall within the protection scope of the present disclosure.

What is claimed is:

1. A display panel, comprising:
   a base substrate, having a first through hole;
   a conductive structure, located on the base substrate and at least partially covering the first through hole, wherein the conductive structure comprises a plurality of block structures, to facilitate connection to a plurality of contacts on a control integrated circuit (IC);
   a display structure, comprising a first display structure, a control line, and a second display structure that are arranged in layers on a side of the base substrate where the conductive structure is located, wherein the first display structure has a second through hole, and the control line is electrically connected to the conductive structure by passing through the second through hole;
   a fingerprint recognition assembly, comprising a perforated light-shielding layer and a fingerprint recognition sensor, wherein the conductive structure and the perforated light-shielding layer are structures located in a same layer, and the fingerprint recognition sensor is located on a side, distal from the display structure, of the perforated light-shielding layer; wherein the perforated light-shielding layer is provided with a plurality of apertures, and light emitted by the display structure and then reflected by a touch object passes through the plurality of apertures and is sensed by the fingerprint recognition sensor; and a base layer located between the conductive structure and the first display structure, wherein the base layer has a third through hole in communication with the second through hole of the first display structure, and the control line is electrically connected to the conductive structure by passing through the second through hole and the third through hole;

wherein the first through hole, the second through hole, and the third through hole are coaxial;

the base substrate comprises a first polyimide structure layer and a first silicon oxide barrier layer that are arranged in layers along a direction close to the display structure, and the first through hole passes through the first polyimide structure layer and the first silicon oxide barrier layer;

the base layer comprises a second polyimide structure layer and a second silicon oxide barrier layer that are arranged in layers along the direction close to the display structure, and the third through hole passes through the second polyimide structure layer and the second silicon oxide barrier layer; and the conductive structure and the perforated light-shielding layer are disposed between the first silicon oxide barrier layer and the second polyimide structure layer.

2. The display panel according to claim 1, wherein a material of the conductive structure and a material of the perforated light-shielding layer comprise metal.

3. The display panel according to claim 1, wherein the conductive structure is located within a display region of the display panel.

4. The display panel according to claim 1, wherein the first display structure comprises a buffer layer and an active layer.

5. The display panel according to claim 4, wherein a material of the buffer layer comprises silicon nitride or silicon oxide.

6. The display panel according to claim 1, wherein the second display structure comprises a driving circuit layer, an organic light-emitting layer, and a package layer that are sequentially arranged along a direction away from the first display structure.

7. The display panel according to claim 1, wherein an orthographic projection of the first through hole onto the base substrate is located within an area formed from an orthographic projection of the conductive structure onto the base substrate.

8. The display panel according to claim 1, wherein the conductive structure is located within a display region of the display panel;

the first display structure comprises a buffer layer and an active layer, the second display structure comprises a driving circuit layer, an organic light-emitting layer, and a package layer that are sequentially arranged along a direction away from the first display structure; and an orthographic projection of the first through hole onto the base substrate is located within an area formed from an orthographic projection of the conductive structure onto the base substrate.

9. A method of manufacturing a display panel, comprising:

providing a base substrate;

forming a conductive structure on the base substrate, wherein the conductive structure comprises a plurality of block structures, to facilitate connection to a plurality of contacts on a control integrated circuit (IC);

forming a display structure on the base substrate on which the conductive structure has been formed, wherein the display structure comprises a first display structure, a control line, and a second display structure that are arranged in layers on a side of the base substrate where the conductive structure is located, the first display structure comprises a second through hole, and the control line is electrically connected to the conductive structure by passing through the second through hole;

forming a first through hole in the base substrate, wherein the conductive structure at least partially covers the first through hole; and forming a base layer between the conductive structure and the first display structure, wherein the base layer has a third through hole in communication with the second through hole of the first display structure, and the control line is electrically connected to the conductive structure by passing through the second through hole and the third through hole;

wherein forming the conductive structure on the base substrate comprises:

forming the conductive structure and a perforated light-shielding layer on the base substrate by a same patterning process, wherein the display panel comprises a fingerprint recognition assembly comprising the perforated light-shielding layer and a fingerprint recognition sensor, and the fingerprint recognition sensor is located on a side, distal from the display structure, of the perforated light-shielding layer; and wherein the perforated light-shielding layer is provided with a plurality of apertures, and light emitted by the display structure and then reflected by a touch object passes through the plurality of apertures and is sensed by the fingerprint recognition sensor;

wherein the first through hole, the second through hole, and the third through hole are coaxial;

the base substrate comprises a first polyimide structure layer and a first silicon oxide barrier layer that are arranged in layers along a direction close to the display structure, and the first through hole passes through the first polyimide structure layer and the first silicon oxide barrier layer;

the base layer comprises a second polyimide structure layer and a second silicon oxide barrier layer that are arranged in layers along the direction close to the display structure, and the third through hole passes through the second polyimide structure layer and the second silicon oxide barrier layer; and the conductive structure and the perforated light-shielding layer are disposed between the first silicon oxide barrier layer and the second polyimide structure layer.

10. The method according to claim 9, wherein forming the first through hole in the base substrate comprises:

forming the first through hole in the base substrate by a laser drilling process.

11. A display device, comprising a control integrated circuit (IC) and a display panel, wherein the display panel comprises:

a base substrate comprising a first through hole;

a conductive structure located on the base substrate and at least partially covering the first through hole, wherein the conductive structure comprises a plurality of block structures, to facilitate connection to a plurality of contacts on the control IC;

a display structure comprising a first display structure, a control line, and a second display structure that are arranged in layers on a side of the base substrate where the conductive structure is located, wherein the first display structure has a second through hole, and the control line is electrically connected to the conductive structure by passing through the second through hole, a fingerprint recognition assembly comprising a perforated light-shielding layer and a fingerprint recognition sensor, wherein the conductive structure and the perforated light-shielding layer are structures located in a same layer, and the fingerprint recognition sensor is located on a side, distal from the display structure, of the perforated light-shielding layer; wherein the perforated light-shielding layer is provided with a plurality of apertures, and light emitted by the display structure and then reflected by a touch object passes through the plurality of apertures and is sensed by the fingerprint recognition sensor; and a base layer located between the conductive structure and the first display structure, wherein the base layer has a third through hole in communication with the second through hole of the first display structure, and the control line is electrically connected to the conductive structure by passing through the second through hole and the third through hole, the first through hole, the second through hole, and the third through hole being coaxial;

wherein the control IC is electrically connected to the conductive structure by passing through the first through hole;

the base substrate comprises a first polyimide structure layer and a first silicon oxide barrier layer that are arranged in layers along a direction close to the display structure, and the first through hole passes through the first polyimide structure layer and the first silicon oxide barrier layer;

the base layer comprises a second polyimide structure layer and a second silicon oxide barrier layer that are arranged in layers along the direction close to the display structure, and the third through hole passes through the second polyimide structure layer and the second silicon oxide barrier layer; and the conductive structure and the perforated light-shielding layer are disposed between the first silicon oxide barrier layer and the second polyimide structure layer.

12. The display device according to claim 11, comprising a flexible base, wherein the control IC is located on the flexible base and is electrically connected to the conductive structure by the flexible base.

13. The display device according to claim 11, wherein the first through hole comprises a conductive adhesive, and the control IC is electrically connected with the conductive adhesive.

\* \* \* \* \*